(12) United States Patent
Price et al.

(10) Patent No.: US 11,406,023 B2
(45) Date of Patent: Aug. 2, 2022

(54) METHODS FOR MANUFACTURING A PLURALITY OF ELECTRONIC CIRCUITS

(71) Applicant: PRAGMATIC PRINTING LTD., Sedgefield (GB)

(72) Inventors: Richard Price, Sedgefield (GB); Stephen Devenport, Sedgefield (GB); Brian Cobb, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 31 days.

(21) Appl. No.: 16/643,642

(22) PCT Filed: Aug. 16, 2018

(86) PCT No.: PCT/GB2018/052327
§ 371 (c)(1),
(2) Date: Mar. 2, 2020

(87) PCT Pub. No.: WO2019/043355
PCT Pub. Date: Mar. 7, 2019

(65) Prior Publication Data
US 2020/0214143 A1   Jul. 2, 2020

(30) Foreign Application Priority Data
Aug. 30, 2017 (GB) .................................. 1713882.7

(51) Int. Cl.
*H05K 3/36* (2006.01)
*H05K 3/00* (2006.01)
*H05K 3/32* (2006.01)

(52) U.S. Cl.
CPC ........... *H05K 3/361* (2013.01); *H05K 3/0058* (2013.01); *H05K 3/323* (2013.01)

(58) Field of Classification Search
CPC ....... H05K 3/361; H05K 3/0058; H05K 3/323
(Continued)

(56) References Cited

U.S. PATENT DOCUMENTS

2002/0070440 A1* 6/2002 Aiba ....................... H01L 24/03
257/E23.021
2007/0292983 A1* 12/2007 Kriman .................. H05K 3/321
438/66
(Continued)

FOREIGN PATENT DOCUMENTS

DE 102005041464 A1 3/2007
JP 2001-118982 A 4/2001
(Continued)

OTHER PUBLICATIONS

Invitation to Pay Additional Fees and, Where Applicable, Protest Fee for International Application No. PCT/GB2018/052327, mailed Nov. 21, 2018.
(Continued)

*Primary Examiner* — Peter Dungba Vo
*Assistant Examiner* — Azm A Parvez
(74) *Attorney, Agent, or Firm* — Jason H. Vick; Sheridan Ross, PC

(57) ABSTRACT

The present invention relates to a method and apparatus for manufacturing a plurality of electronic circuits, each electronic circuit comprising a respective flexible first portion, comprising a respective group of contact pads (contacts), and a respective flexible integrated circuit, IC, comprising a respective group of terminals and mounted on the respective group of contact pads with each terminal in electrical contact with a respective contact pad, the method comprising:
providing (e.g. manufacturing) a flexible first structure comprising the plurality of first portions;
providing (e.g. manufacturing) a second structure comprising the plurality of flexible ICs and a common support arranged to support the plurality of flexible ICs;
dispensing an adhesive onto the first structure and/or onto the flexible ICs;

(Continued)

transferring said flexible ICs from the common support onto the flexible first structure such that each group of terminals is mounted on (brought into electrical contact with) a respective group of contact pads to form an electronic circuit, providing a heated surface and an opposing surface together having a gap therebetween, transferring the flexible first structure, comprising the electronic circuits, between the heated surface and the opposing surface such that the adhesive is cured by application of heat and pressure from the heated surface and the opposing surface thereby adhering the IC onto the respective first portion.

12 Claims, 6 Drawing Sheets

(58) Field of Classification Search
USPC .............................. 29/830, 829, 825, 592.1
See application file for complete search history.

(56) References Cited

U.S. PATENT DOCUMENTS

| 2010/0071206 | A1  | 3/2010 | Kerr et al. |
| 2013/0154885 | A1* | 6/2013 | Schindler ............... H05K 3/305 |
| | | | 156/247 |
| 2013/0322032 | A1* | 12/2013 | Shigetaka ............... G06F 3/041 |
| | | | 156/60 |
| 2015/0319843 | A1* | 11/2015 | Lim ....................... H05K 1/118 |
| | | | 29/842 |

FOREIGN PATENT DOCUMENTS

| KR | 2010-0074381 A | | 7/2010 |
| KR | 20100074381 A | * | 7/2010 |
| WO | WO 2005/099310 A | | 10/2005 |
| WO | WO 2006/099885 | | 9/2006 |
| WO | WO 2010/036324 | | 4/2010 |
| WO | WO 2015/094259 | | 6/2015 |
| WO | WO 2017/141013 | | 8/2017 |

OTHER PUBLICATIONS

International Search Report for International Application No. PCT/GB2018/052327, dated Feb. 13, 2019.

Written Opinion for International Application No. PCT/GB2018/052327, dated Feb. 13, 2019.

Search Report for Great Britain Application No. 1713882.7, dated Feb. 28, 2018.

International Preliminary Report on Patentability for International Application No. PCT/GB2018/052327, dated Mar. 12, 2020.

Examination Report Under Section 18(3) for Great Britain Application No. 1713882.7, dated Oct. 14, 2021.

Examination Report Under Section 18(3) for Great Britain Application No. 1713882.7, dated Feb. 14, 2022.

* cited by examiner

METHODS FOR MANUFACTURING A PLURALITY OF ELECTRONIC CIRCUITS

CROSS REFERENCE TO RELATED APPLICATIONS

This application is a national stage application under 35 U.S.C. 371 of PCT Application No. PCT/GB2018/052327, having an international filing date of 16 Aug. 2018, which designated the United States, which PCT application claimed the benefit of Great Britain Application No. 1713882.7, filed 30 Aug. 2017, each of which are incorporated herein by reference in their entirety.

FIELD

The present invention relates to methods and apparatus for manufacturing a plurality of electronic circuits, and in particular, although not exclusively, for methods and apparatus suitable for mass production of high volumes of flexible electronic circuits.

BACKGROUND

A wide variety of techniques are known for incorporating integrated circuits into larger electronic circuits which are typically mounted on contact pads. Integrated circuits (or ICs) are typically presented as an array of densely packed ICs on a common support (e.g. wafer). Those ICs are separated from that common support (typically a rigid support such as silicon or the like) and transferred to their final or target destination on the larger electronic circuit.

The larger electronic circuit may comprise a flexible support having contact pads depending therefrom and configured to electronically connect with the ICs. To aid adhesion and mounting of the ICs, each of the contact pads is typically provided with conductive adhesive. Thus, the flexible support is provided with contacts and patterned conductive adhesive.

During manufacture of the electronic circuits, ICs are transferred from an initial common support (e.g. a wafer) to their installation positions adjacent a set of contact pads. The conductive adhesive mounts and adheres the ICs to the contact pads thereby forming the electronic circuit. Once the ICs are placed in contact with the adhesive on the contact pads, a thermode (or multiple parallel thermodes) is used to bond the IC to the contacts of the larger electronic circuit using heat and pressure.

These techniques and apparatus pose a number of problems, which are well known in the art. Particularly, in the case of thin and/or flexible ICs the provision of suitable handling is particularly challenging. For example, thin and/or flexible ICs are particularly delicate and may be damaged by inappropriate handling, leading to failure of the eventual electronic circuits in which they are incorporated.

Further, the existing apparatus use a indexing, "step and repeat" system for bonding the IC to the contact pads using a thermode to apply heat and pressure. In such systems, the thermode(s) is brought into contact with the IC/adhesive/contact pad assembly then removed ready for the next IC/adhesive/contact pad assembly to be brought into proximity with the thermode(s). This is a slow and cumbersome process.

The present invention provides at least an alternative to the "step and repeat" electronic circuit manufacturing processes and apparatus of the prior art.

BRIEF SUMMARY OF THE DISCLOSURE

Accordingly, it is an object of certain embodiments of the invention to provide methods and apparatus for manufacturing a plurality of electronic circuits which overcome, at least partly, one or more of the problems associated with the prior art.

According to a first aspect of the invention there is provided a method of manufacturing a plurality of electronic circuits, each electronic circuit comprising a respective flexible first portion, comprising a respective group of contact pads (contacts), and a respective flexible integrated circuit, IC, comprising a respective group of terminals and mounted on the respective group of contact pads with each terminal in electrical contact with a respective contact pad, the method comprising:

providing (e.g. manufacturing) a flexible first structure comprising the plurality of first portions;

providing (e.g. manufacturing) a second structure comprising the plurality of flexible ICs and a common support arranged to support the plurality of flexible ICs;

dispensing an adhesive onto the first structure and/or onto the flexible ICs;

transferring said flexible ICs from the common support onto the flexible first structure such that each group of terminals is mounted on (brought into electrical contact with) a respective group of contact pads to form an electronic circuit, providing a heated surface and an opposing surface together having a gap therebetween, transferring the flexible first structure, comprising the electronic circuits, between the heated surface and the opposing surface such that the adhesive is cured by application of heat and pressure from the heated surface and the opposing surface thereby adhering the IC onto the respective first portion.

In certain embodiments the first structure is a flexible web. More specifically, in certain embodiments the flexible web is polyethylene terephthalate (PET).

In certain embodiments, the flexible ICs comprise a flexible plastic base material.

In certain embodiments, the adhesive is applied as a laminate layer to the first structure and/or to the flexible ICs held on the common support.

In certain embodiments, the adhesive is applied to a predefined area of the first structure, the predefined area comprising at least the area of the first structure comprising the respective group of contact pads (contacts) of each of the plurality of first portions. Alternatively the predefined area of the first structure comprises the area around the contact pads and excludes the contact pads.

In certain embodiments, the adhesive is applied to a predefined area of the IC. More specifically, the predefined area may comprise at least the area of the IC comprising the respective group of terminals of each of the plurality of ICs. Alternatively the predefined area of the IC comprises the base layer of the IC and excludes the terminals of the IC.

In certain embodiments, the adhesive forms raised bond pads on the, or each flexible IC. Each bond pad may have a depth of between 0.5 μm and 10 μm.

In certain embodiments, the adhesive is dispensed onto discrete areas including each of the first portions of the first structure and/or each of the flexible ICs on the common support.

In certain embodiments, the adhesive is dispensed onto the flexible IC (for example between the terminals of the IC) and/or onto the flexible first substrate (for example between contact pads of a first portion). In certain embodiments, the adhesive is dispensed onto discrete areas in a controlled amount. In this way, the adhesive does not cover the entire surface.

In certain embodiments, the adhesive is dispensed onto the terminals of the, or each, flexible IC and/or onto the contact pads of the, or each, first portion. In certain embodiments, the adhesive is dispensed onto these discrete areas in a controlled amount. In this way, the adhesive does not cover the entire surface of the first portion and/or the flexible IC.

In certain embodiments the adhesive is conductive, pressure sensitive, non-conductive, isotropic and/or anisotropic.

In certain embodiments, an anisotropic conductive adhesive is applied over the whole area of the flexible IC. In certain embodiments, the anisotropic conductive adhesive is applied over the whole area of the flexible IC, in the form of a pre-cast film, by lamination.

In certain embodiments, a non-conductive adhesive is applied over the whole area of the flexible IC. In certain embodiments, the non-conductive adhesive is applied over the whole area of the flexible IC, in the form of a pre-cast film, by lamination.

In certain embodiments, the adhesive is conductive. More specifically, the cured conductive adhesive forms an electrical attachment of the terminals of the IC onto the group of contact pads of the first portion.

In certain embodiments, the adhesive is non-conductive. More specifically, the non-conductive adhesive is flowed under heat and pressure applied by the heated surface and opposing surface (for example from a pair of nip rollers). Yet more specifically, the non-conductive adhesive is flowed away from the contact pads of the, or each, first portion by application of heat and pressure from the heated surface and opposing surface (e.g. pair of nip rollers) such that the adhesive adheres the IC and the first portion together and the terminals of the IC and the contact pads of the first portion are electrically connected and free of non-conductive adhesive.

In certain embodiments, the non-conductive adhesive is flowed away from the terminals of the, or each, IC by application of heat and pressure from the heated surface and opposing surface (e.g. pair of nip rollers) such that the adhesive adheres the IC and the first portion together and the terminals of the IC and the contact pads of the first portion are electrically connected and free of non-conductive adhesive.

In certain embodiments, the flexible first structure is continuously transferred between the heated surface and the opposing surface (e.g. the nip rollers). In this way, successive ICs are bonded to successive first portions on the flexible first structure. In this way, the heated surface (e.g. the heated surface of the nip roller) is configured to bond ICs (once transferred from the common support) with respective secondary (optionally printed) circuits on respective first portions on a continuous basis. The process of the invention enables a continuous method which can dramatically increase the output of electronic circuits from the apparatus.

In certain embodiments the heated surface and the opposing surface are provided by a pair of nip rollers. More specifically the heated surface is on a first nip roller and the opposing surface is on a second nip roller and the first and second nip rollers form a pair of nip rollers.

In certain embodiments each roller in the pair of nip rollers comprises a heated roller surface. That is to say, both the heated surface and the opposing surface are heated.

In certain embodiments, the, or each, roller of the pair of nip rollers comprises a heated core. More specifically, the heated core is configured (adapted) to transfer heat to the surface of the nip roller.

In certain embodiments, the heated core may comprise a heating element. In certain embodiments, the heating element is connected to a power source (e.g. a mains electricity power source, a battery or the like).

In certain embodiments, the, or each, roller of the pair of nip rollers comprises a surface layer wrapped around a core. In certain embodiments, the surface layer is heated. More specifically, the surface layer may be directly heated or indirectly heated. In this way, a heated core of the roller may heat the surface thereof.

In certain embodiments, a silicone paper layer is located between the electronic circuits and the surface of the, or each roller. In this way, the silicone paper protects the roller core from fouling with excess adhesive. In certain embodiments, the silicone paper is indexed to provide a fresh surface once it is excessively soiled with adhesive.

In certain embodiments, the first structure may be transferred between a plurality of pairs of nip rollers in succession. More specifically, each pair of nip rollers may have one or more of: a different gap between the pair of rollers, a different temperature of heated roller(s), and/or may apply a different pressure to the electronic circuit.

In certain embodiments multiple pairs of nip rollers are provided, with an initial pair of nip rollers operable to bring the contact pads of a first portion and terminals of a respective IC together, followed by a further pair or successive pairs of nip rollers with increasing pressure and/or heat to cure the adhesive, followed by a further pair of nip rollers with a lower temperature than the first and/or further pair of nip rollers (e.g. below the cure temperature and/or the flow temperature of the adhesive).

In certain embodiments, the adhesive is applied to the first structure and/or to the flexible ICs by screen printing, deposition, electro-plating, by jet dispensing or time pressure dispensing.

In certain embodiments, the cured adhesive may be treated to improve the bond between the IC and the respective first portion. More specifically, the cured adhesive may be treated by agitation and/or by laser to improve the bond strength provided between the first portion and the respective IC.

In certain embodiments, the flexible ICs are transferred from the common support onto the flexible first structure by a pick and place or by a transfer roller process.

In certain embodiments, the contact time between the heated surface and the opposing surface (e.g. the pair of nip rollers) and the IC/adhesive/first portion assembly is predetermined. The predetermined time may be up to 10 seconds. More preferably, the contact time is less than 1 second. The speed of the flexible first structure through the, or each, heated surface and the opposing surface (e.g. the pair of nip rollers) and the pressure and heat applied thereto will control the curing time of the adhesive.

In certain embodiments, the pressure applied to the flexible first structure comprising the electronic circuits is adjustable. More specifically, the gap between the heated surface and the opposing surface (e.g. the pair of nip rollers) is adjustable. Yet more specifically, one or both of the heated surface and the opposing surface (e.g. the pair of nip rollers) is/are moveable (for example in a direction perpendicular to its/their respective axis of rotation) to adjust the gap between the adjacent surfaces (e.g. of the rollers) at the narrowest point. In this way, the pressure applied to the IC/adhesive/first portion assembly during curing of the adhesive is adjustable.

In certain embodiments, each first portion may comprise an electronic circuit in electrical contact with the group of contact pads. More specifically, in certain embodiments, the electronic circuit may be a printed circuit.

According to an aspect of the present invention there is provided an apparatus arranged to implement a method in accordance with any preceding claim.

According to a further aspect, the present invention provides an apparatus for bonding a plurality of flexible electronic components (ICs) having a group of terminals to a plurality of respective first portions having a group of contact pads to form a plurality of electronic circuits utilising a curable adhesive, the apparatus comprising:
a heated surface and an opposing surface together providing a gap for receiving a flexible first structure comprising a plurality of first portions;
a first support means (roller, structure, assembly, mechanism) arranged (adapted, configured) to support a flexible first structure comprising the plurality of first portions and controllable to translate said a flexible first structure (i.e. when supported by the first support means) relative to the heated surface and opposing surface and into the gap therebetween;
a second support means (structure, assembly, mechanism) arranged (adapted, configured) to support a second structure, comprising the plurality of flexible electronic components;
an adhesive dispensing means (nozzle, printer, manifold) arranged (adapted, configured) to dispense curable adhesive onto the flexible first portion and/or onto the plurality of flexible electronic components;
a heating means (heating element) arranged (adapted, configured) to heat the heated surface and to cure the curable adhesive,
a transfer means (roller, mechanism) to transfer the flexible electronic components from the second structure onto a respective first portion such that each group of terminals is mounted on (brought into electrical contact with) a respective group of contact pads, drive means (roller driving structure, assembly, system, mechanism, or at least one roller
driver, for example comprising at least one drive motor) controllable to drive the first support means to translate the flexible first structure relative to said heated surface and opposing surface;
control means (e.g. a control system, or at least one controller, control unit, or control module) arranged to control the drive means and first and second support means to transfer said flexible electronic components (ICs) from the second structure onto the flexible first structure such that each group of terminals is mounted on (brought into electrical contact with) a respective group of contact pads.

In certain embodiments, the flexible first portion comprises a flexible web circuit. More specifically, the flexible web circuit comprises a plurality of first portions.

In certain embodiments, the heated surface and the opposing surface are provided by a pair of nip rollers, at least one of the rollers of the pair of nip rollers comprising a heated surface.

In certain embodiments each of said rollers in the pair of nip rollers is arranged to rotate about a rotational axis.

In certain embodiments the first support means (roller, structure, assembly, mechanism) is arranged (adapted, configured) to support the flexible web circuit comprising the plurality of first portions and is controllable to translate said a flexible web circuit (i.e. when supported by the first support means) relative to said rotational axes.

In certain embodiments the second support means (structure, assembly, mechanism) is arranged (adapted, configured) to support the second structure comprising the plurality of flexible electronic components.

In certain embodiments the heating means (heating element) is arranged (adapted, configured) to heat the surface of the at least one of the rollers of the pair of nip rollers and to cure the curable adhesive, In certain embodiments, the drive means (roller driving structure, assembly, system, mechanism, or at least one roller driver, for example comprising at least one drive motor) is controllable to drive the first support means to translate the flexible web circuit relative to said respective rotational axes.

In certain embodiments, the control means (e.g. a control system, or at least one controller, control unit, or control module) is arranged to control the drive means, the nip rollers and first and second support means to transfer said ICs from the second structure onto the flexible web circuit such that each group of terminals is mounted on (brought into electrical contact with) a respective group of contact pads.

In certain embodiments, the control means is arranged to control the distance between the rotational axes of the pair of nip rollers. In this way, the gap between the adjacent surfaces of the rollers at their narrowest point is controlled by the control means.

In certain embodiments, the apparatus comprises two or more pairs of nip rollers. It is much preferred that a heating means (heating element) is arranged (adapted, configured) to heat the surface of at least one of the rollers of each pair of nip rollers.

In certain embodiments, the control means is arranged to control the distance between the rotational axes of each pair of nip rollers. In this way, the gap between the adjacent surfaces of the rollers in each pair at their narrowest point is controlled by the control means.

In certain embodiments the, or each roller of the, or each pair of nip rollers comprises a heated core. In this way, the surface of the roller is heated by transfer of heat from the heated core to the surface of the roller.

In certain embodiments, the heated core may comprise a heating element. In certain embodiments, the heating element is connected to a power source (e.g. an mains electricity power source, a battery or the like).

In certain embodiments, the, or each, roller of the pair of nip rollers comprises a surface layer wrapped around a core. In certain embodiments, the surface layer is heated. More specifically, the surface layer may be directly heated or indirectly heated. In this way, a heated core of the roller may heat the surface thereof.

In certain embodiments, a silicone paper layer is provided between the flexible first structure and the heated surface (e.g. the roller). More specifically, the silicone paper layer is located between the flexible electronic components and the heated surface. In this way, the silicone paper protects the heated surface (e.g. the roller) from fouling with excess adhesive. In certain embodiments, the silicone paper is indexed to provide a fresh surface once it is excessively soiled with adhesive.

In certain embodiments, the adhesive dispensing means comprises a screen printer, a jet nozzle dispenser or a time pressure dispenser.

According to a further aspect, the present invention provides an apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a pair of nip rollers, at least one of the rollers of the pair of nip rollers comprising a heated surface, each of said rollers in the pair of nip rollers being arranged to rotate about a rotational axis, a first support means (roller, structure, assembly, mechanism) arranged (adapted, configured) to support a flexible first structure comprising the plurality of first portions and controllable to translate said first flexible structure (i.e. when supported by the first support means) relative to said rotational axes;

a second support means (structure, assembly, mechanism) arranged (adapted, configured) to support a second structure, comprising the plurality of flexible ICs;

an adhesive dispensing means (nozzle, printer) arranged (adapted, configured) to dispense curable adhesive onto the plurality of first portions flexible first structure;

a heating means (heating element) arranged (adapted, configured) to heat the surface of the at least one of the rollers of the pair of nip rollers and to cure the curable adhesive, a transfer means (roller, mechanism) to transfer the flexible ICs from the second structure onto the flexible first structure such that each group of terminals is mounted on (brought into electrical contact with) a respective group of contact pads, drive means (roller driving structure, assembly, system, mechanism, or at least one roller driver, for example comprising at least one drive motor) controllable to drive the first support means to translate the flexible first structure relative to said respective rotational axes;

control means (e.g. a control system, or at least one controller, control unit, or control module) arranged to control the drive means, the nip rollers and first and second support means to transfer said ICs from the second structure onto the flexible first structure such that each group of terminals is mounted on (brought into electrical contact with) a respective group of contact pads.

BRIEF DESCRIPTION OF THE DRAWINGS

Embodiments of the invention are further described hereinafter with reference to the accompanying drawings, in which.

DETAILED DESCRIPTION

Like numerals are used to denote similar features throughout the figures.

Figure 1A:
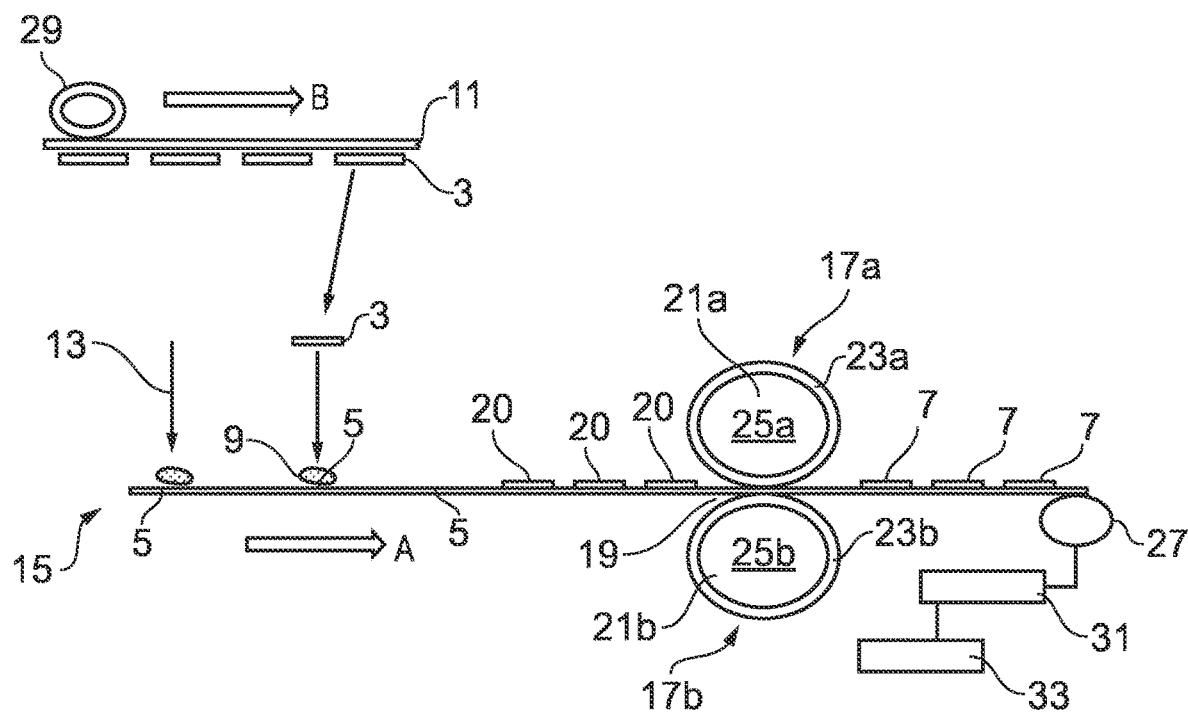
FIG. 1a is a schematic representation of an apparatus for bonding a plurality of flexible electronic components (ICs) to a plurality of respective first portions according to an embodiment of the invention.

Referring to FIG. 1a, an apparatus 1 for bonding a plurality of flexible electronic components (ICs) 3 to a plurality of respective first portions 5 to form a plurality of electronic circuits 7 utilising a curable adhesive 9 is shown.

The integrated circuits 3 are initially provided on a common support 11. Adhesive 9 is dispensed from a nozzle 13 onto a first portion 5 formed on first structure 15 in the form of a flexible web of polyethylene terephthalate (PET). Each first portion 5 comprises contact pads (not shown), upwardly facing from the surface of the flexible web 15, and electrically contact to the electronic circuit printed on web 15.

The flexible web 15 is translated in the direction "A" by drive means (not shown) towards of a pair of nip rollers 17a and 17b. The pair of nip rollers 17a and 17b have a gap 19 therebetween through which the flexible web 15, comprising a plurality of IC/adhesive/first portion assemblies 20 is continuously translated. The adhesive in assembly 20 is uncured. Each nip roller 17a, 17b comprises a core 21a, 21b and an outer surface 23a, 23b. The core 21a, 21b of each roller is heated by a heating element 25a, 25b which in turn heats the surface 23a, 23b of the roller.

The heated surface 23a and the opposing heated surface 23b together providing a gap 19 for receiving the IC/adhesive/first portion assembly 20 on flexible web 15. The roller 27 is arranged to support the flexible web 15 comprising the plurality of first portions 5 and is controllable to translate the a flexible web 15 (i.e. when supported by the first support means) relative to the heated surface 23a and opposing surface 23b and into the gap 19 therebetween.

Roller 29 is arranged to support common support 11 comprising the plurality of flexible electronic components (ICs) 3. Roller 29 is driven by a drive means (not shown) such as a motor or the like and is operable to move the common support 11 in direction "B".

Nozzle 13 is operable to dispense curable adhesive onto the flexible web 15 and onto each first portion 5.

A pick and place device (or a transfer roller) (not shown) is used to transfer the flexible electronic components 3 from the common support 11 onto a respective first portion 5 such that each group of terminals of the flexible electronic components 3 is mounted on (brought into electrical contact with) a respective group of contact pads on each first portion 5.

The heating elements 25a and 25b are operable to heat the heated surface 23a of roller 17a and the heated surface 23b of roller 17b respectively and to cure the curable adhesive in each assembly 20 to produce an electronic circuit 7 in which the adhesive is cured and the IC 3 and the first portion 5 are adhered to one another.

A roller driver 31 comprising a drive motor is controllable to drive roller 27 to translate the flexible web 15 relative to said heated surface 23a and opposing surface, heated surface 23b.

A control unit 33 is arranged to control the roller driver 31 and first and second support means (rollers 27, 29) to transfer said ICs from the common support 11 onto the flexible web 15 such that each group of terminals is mounted on (brought into electrical contact with) a respective group of contact pads.

The control unit 33 is arranged to control the distance between the rotational axes of the pair of nip rollers 17a and 17b. In this way, the gap 19 between the adjacent surfaces 23a, 23b of the rollers at their narrowest point is controlled by the control unit 33.

Figure 1B:
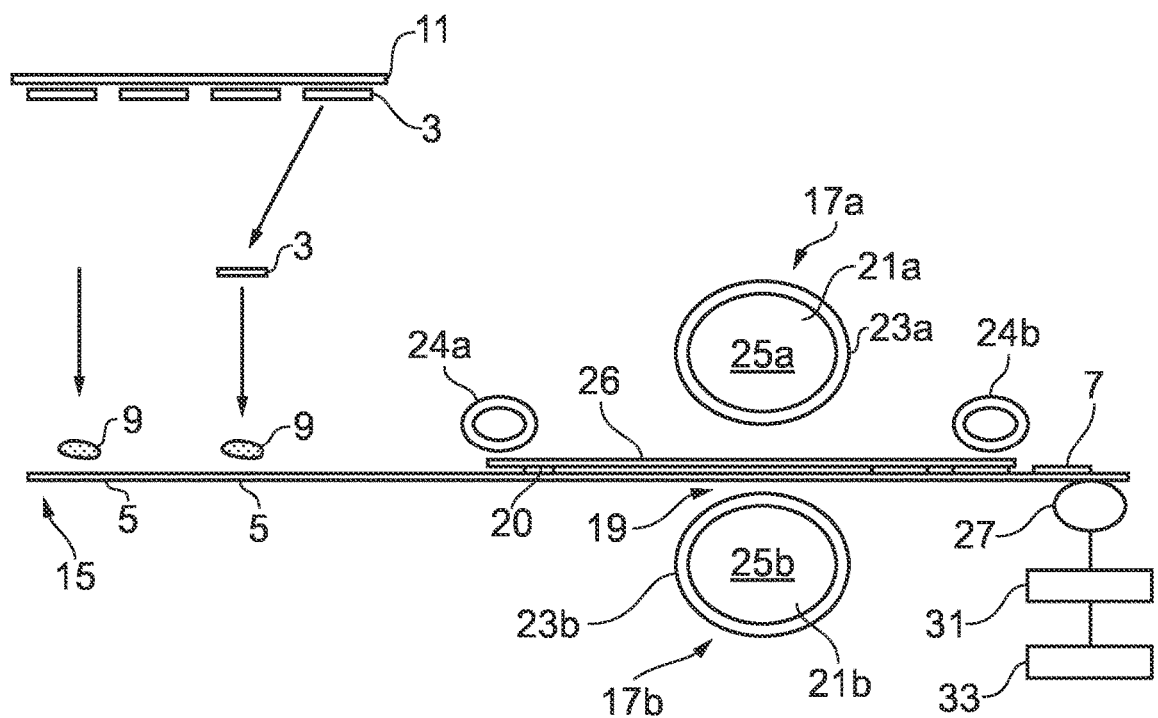
FIG. 1b is a schematic representation of an according to FIG. 1a further comprising a silicone paper layer to prevent excess adhesive fouling the rollers.

The apparatus of FIG. 1b is identical to the apparatus 1 of FIG. 1a except for the provision of a further silicone paper layer 26 positioned between the assembly 20 and the roller 17a. This silicone paper 26 can be indexed by operation of drive rollers 24a, 24b as necessary to provide a fresh silicone paper layer once it is excessively soiled with adhesive 9. In FIG. 1b, the gap 19 between the rollers 17a and 17b is exaggerated in size for clarity. The rollers 17a, 17b come together to provide gap 19 and contact between the roller 17a, silicone paper layer 26, assembly 20 and roller 17b.

Figure 4:
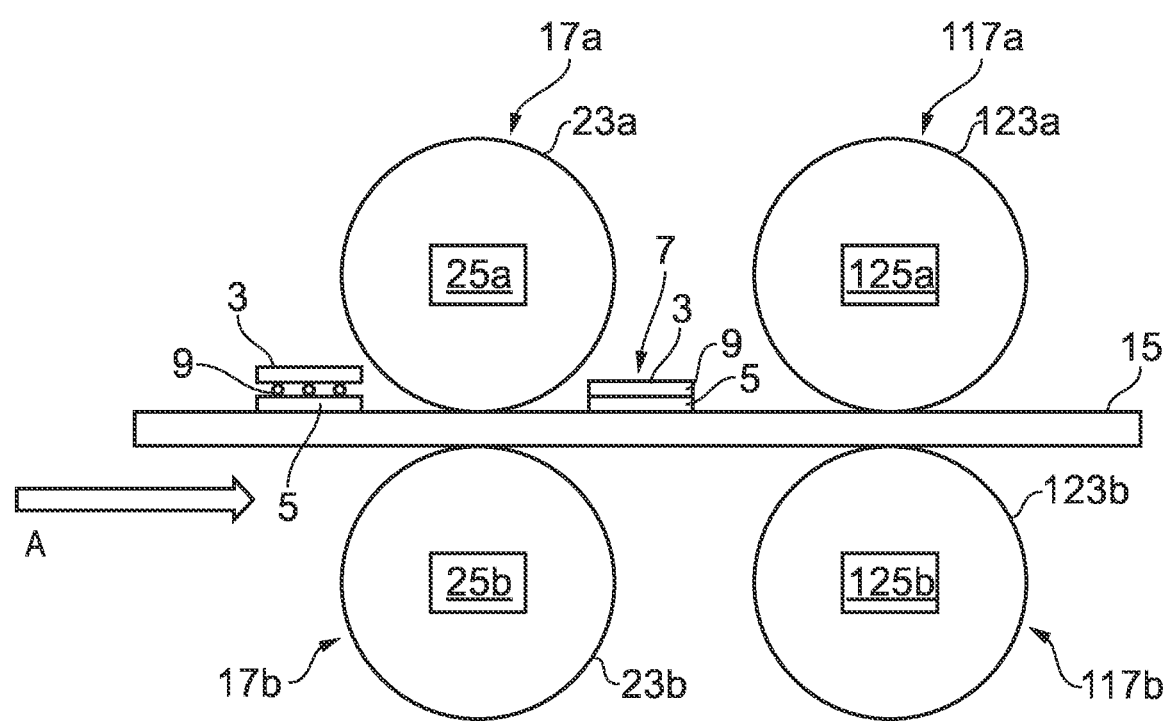
FIG. 4 is a schematic representation of an apparatus for bonding a plurality of flexible electronic components (ICs) to a plurality of respective first portions according to a further embodiment of the invention.

As best seen in FIG. 4, in embodiments of the apparatus there are two pairs of nip rollers 17a, 17b and 117a, 117b respectively. Respective heating elements 25a, 25b, 125a, 125b are arranged (adapted, configured) to heat the surfaces 23a, 23b, 123a, 123b of each of the rollers 17a, 17b, 117a, 117b of each pair of nip rollers.

The flexible web 15 comprising assemblies of IC (3)/adhesive (9)/first portion (5) is advanced continuously in direction "A", and the first pair of nip rollers 17a/17b applies heat and pressure to the assembly in order to cure adhesive 9 to form electronic circuit 7. The circuit 7 on flexible web 15 continues to a second pair of nip rollers 117a/117b where heated surfaces 123a, 123b apply heat and pressure to the electronic circuit 7 to strengthen the adhesive bond between the IC 3 and the first portion 5.

Figure 2:
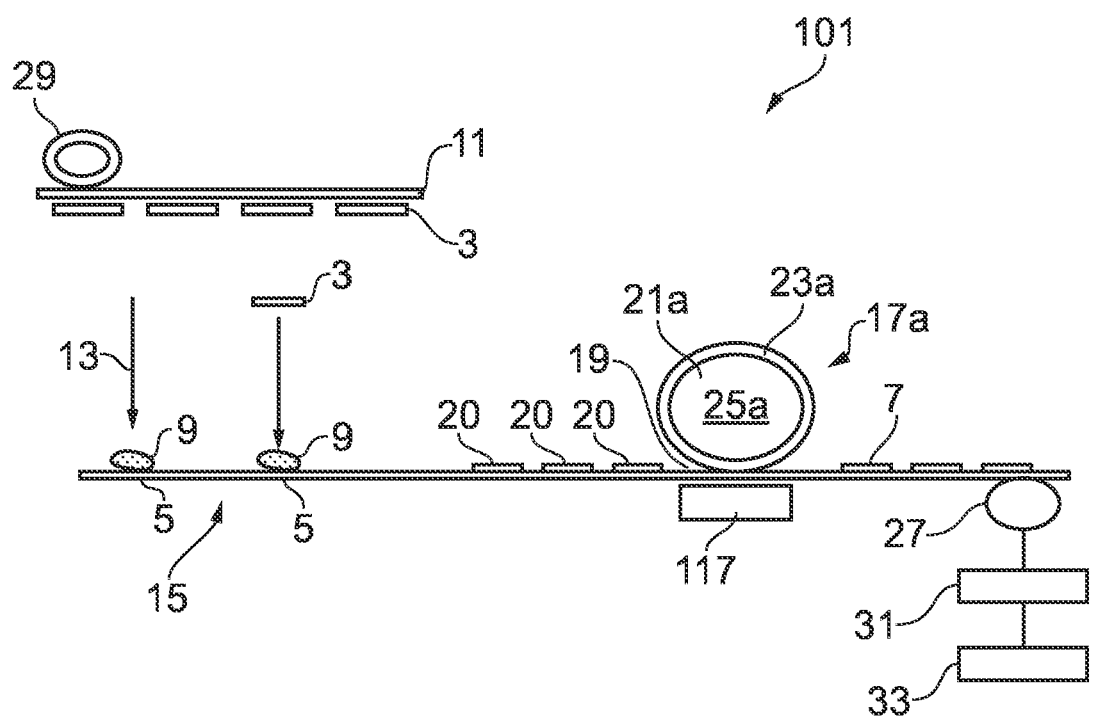
FIG. 2 is a schematic representation of an apparatus for bonding a plurality of flexible electronic components (ICs) to a plurality of respective first portions according to a further embodiment of the invention.

In the alternative embodiment depicted in FIG. 2, the apparatus 101 is similar to apparatus 1 of FIG. 1 with the exception that the heated surface and the opposing surface of the invention are provided by roller 17a and planar surface 117. In the depicted embodiment, flexible web 15 is passed through the gap 19 between the heated roller 17a and the planar surface 117. The heat from the surface 23a of heated roller 17a and the nip pressure between roller 17a and surface 117 cure the adhesive 9 in assembly 20.

Figure 5:
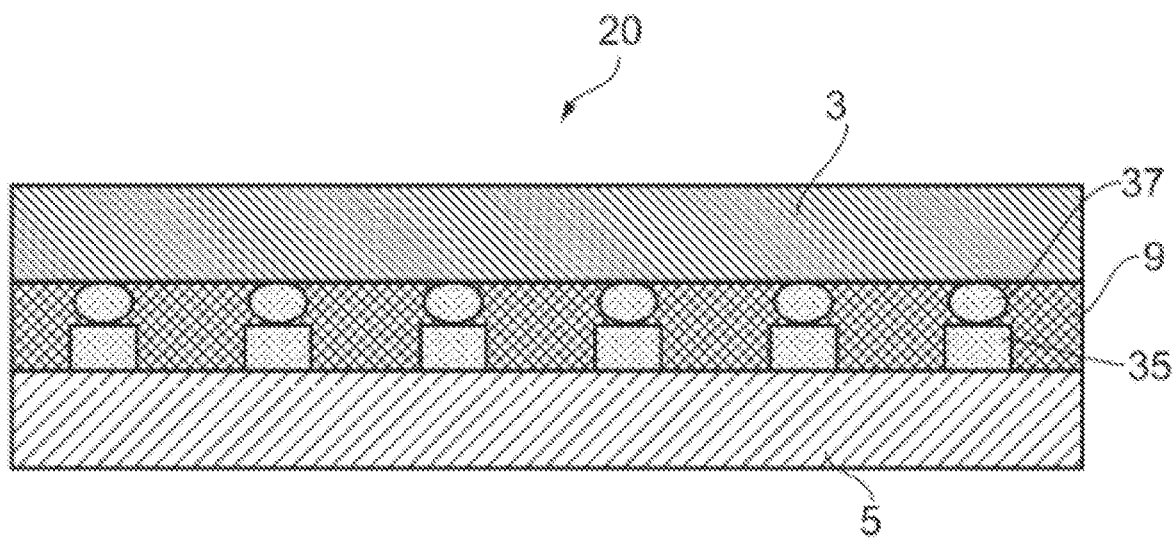
FIG. 5 shows an electronic circuit manufactured in accordance with an embodiment of the method according to the invention comprising an IC adhered to a first portion by a layer of non-conductive adhesive.

Each assembly 20 is formed of an IC 3, adhesive 9 and a first portion 5. In the assembly 20, the adhesive is uncured and the assembly 20 is ready to be passed through the gap 19 between the heated surface and the opposing surface in order to cure the adhesive and form electronic circuit 7. As best seen in FIG. 5, each assembly comprises an integrated circuit 3 having a plurality of terminals 37. A layer of adhesive 9 is applied to the first portion 5 in the area between the contact pads 35 of the first portion 5. The terminals 37 contact respective contact pads 35 in order to form an electrical contact between the IC 3 and the first portion 5. As can be seen in either FIG. 1 or FIG. 2, passing assembly 20 through the nip rollers 17a, 17b or through the gap 19 between roller 17a and surface 117 applies heat and pressure to the assembly, thereby curing the adhesive 9 and forming electronic circuit 7.

Figure 3A:
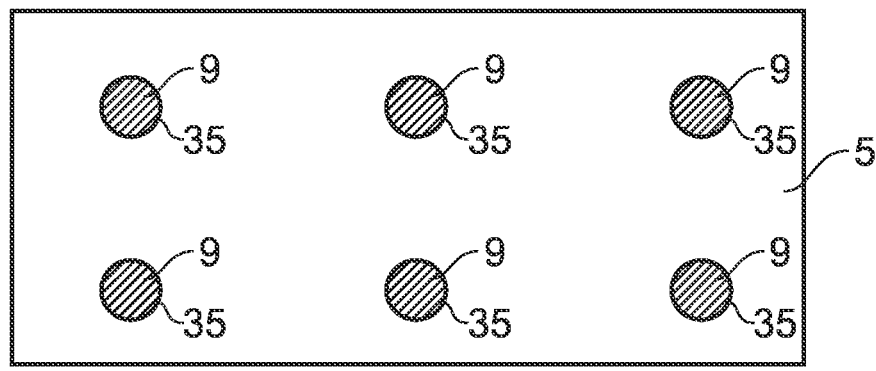
FIG. 3a-FIG. 3c are schematic representations of adhesive applied to areas of a first portion.
Figure 3B:
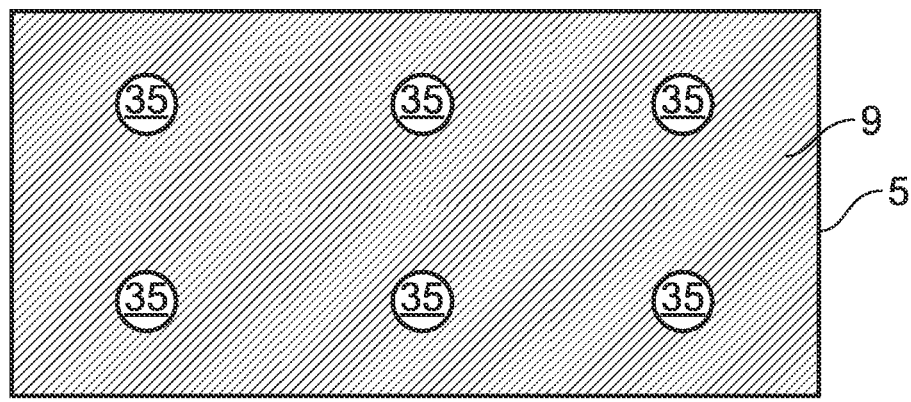
Figure 3C:
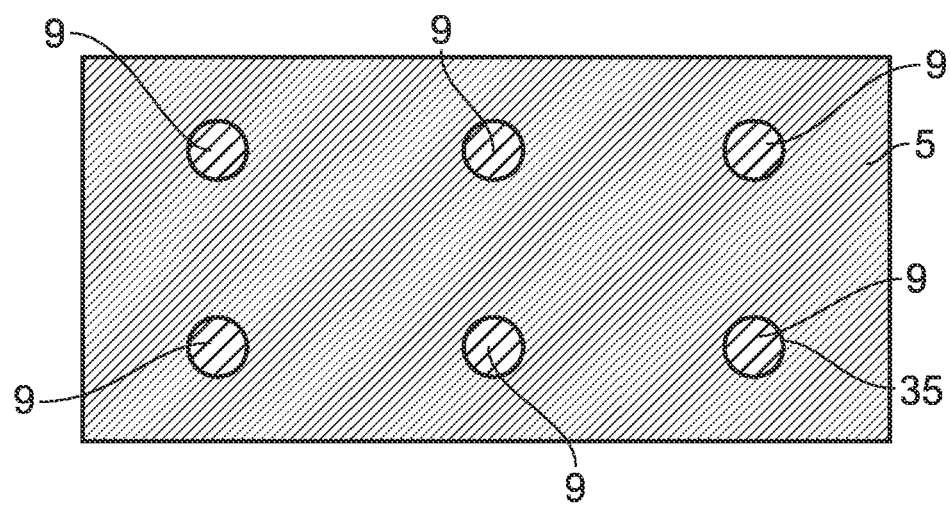

FIGS. 3a, 3b and 3c depict alternative patterns for dispensing adhesive 9 onto a first portion 5. In FIG. 3a, a conductive adhesive is dispensed only onto the contact pads 35. When the first portion contact pads 35 are brought into contact with respective terminals of an IC (not shown), the conductive adhesive 9 between the contact pads 35 and the terminals can be cured to form an electrical and mechanical attachment between the first portion 5 and the IC.

In FIG. 3b, a non-conductive adhesive is applied to the areas around the contact pads 35. The application of the adhesive in this embodiment can be to the whole first portion 5 and the application of heat and pressure to the first portion/adhesive/IC assembly will cause the non-conductive adhesive 9 to flow away from the contact pads 35 into the areas shown in FIG. 3b.

The adhesive 9 of FIG. 3c is applied as a laminate layer to the first portion 5.

Figure 6:
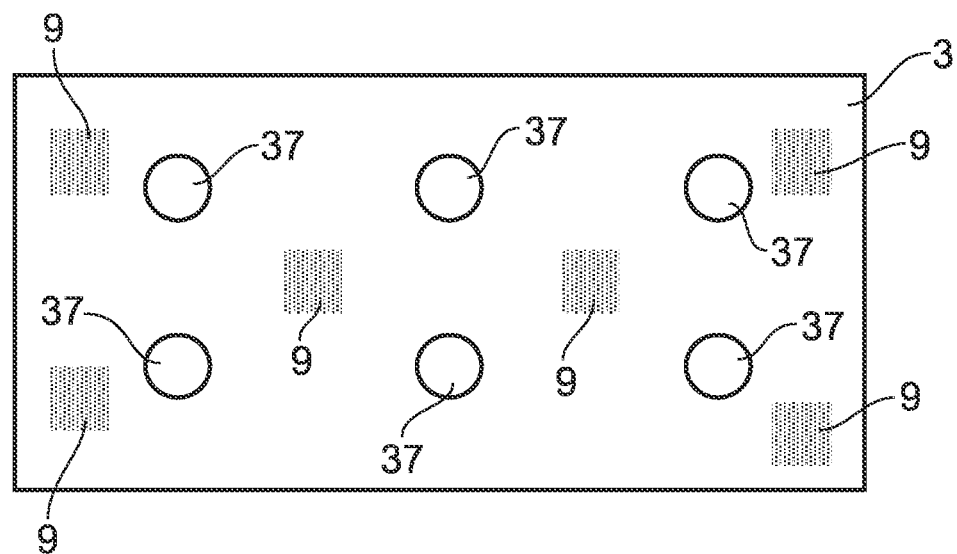
FIG. 6 is a schematic representation of adhesive applied to discrete areas of an IC.

FIG. 6 depicts an exemplary adhesive pattern applied to an IC 3. The adhesive 9 is applied by a nozzle in discrete patches on the base layer of an IC 3 around the terminals 37.

It should be understood that the adhesive application patterns of FIGS. 3a, 3b and 3c could be those applied to an IC and that the adhesive application pattern of FIG. 6 could be applied to a first portion.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

Below, there is provided a non-exhaustive list of non-limiting clauses. Any one or more of the features of these examples may be combined with any one or more features of another clause, embodiment or aspect described herein.

Aspects:
1. A method of manufacturing a plurality of electronic circuits, each electronic circuit comprising a respective flexible first portion, comprising a respective group of contact pads (contacts), and a respective flexible integrated circuit, IC,
   comprising a respective group of terminals and mounted on the respective group of contact pads with each terminal in electrical contact with a respective contact pad, the method comprising:
   providing (e.g. manufacturing) a flexible first structure comprising the plurality of first portions;

providing (e.g. manufacturing) a second structure comprising the plurality of flexible ICs and a common support arranged to support the plurality of flexible ICs;

dispensing an adhesive onto the first structure and/or onto the flexible ICs;

transferring said flexible ICs from the common support onto the flexible first structure such that each group of terminals is mounted on (brought into electrical contact with) a respective group of contact pads to form an electronic circuit, providing a heated surface and an opposing surface together having a gap therebetween, transferring the flexible first structure, comprising the electronic circuits, between the heated surface and the opposing surface such that the adhesive is cured by application of heat and pressure from the heated surface and the opposing surface thereby adhering the IC onto the respective first portion.

2. A method according to aspect 1, wherein the first structure is a flexible web.

3. A method according to aspect 1 or aspect 2, wherein the flexible ICs comprise a flexible plastic base material.

4. A method according to any one of aspects 1 to 3, wherein the adhesive is applied as a laminate layer to the first structure and/or to the flexible ICs held on the common support.

5. A method according to any one of the preceding aspects, wherein the adhesive is applied to a predefined area of the first structure, the predefined area comprising at least the area of the first structure comprising the respective group of contact pads (contacts) of each of the plurality of first portions.

6. A method according to any one of aspects 1 to 5, wherein the adhesive is applied to a predefined area of the first structure, the predefined area of the first structure comprising the area around the contact pads and excluding the contact pads.

7. A method according to any one of the preceding aspects, wherein the adhesive is applied to a predefined area of the IC.

8. A method according to aspect 7, wherein the predefined area comprises at least the area of the IC comprising the respective group of terminals of each of the plurality of ICs.

9. A method according to aspect 7, wherein the predefined area of the IC comprises the base layer of the IC and excludes the terminals of the IC.

10. A method according to any one of the preceding aspects, wherein the adhesive forms raised bond pads on the, or each flexible IC.

11. A method according to aspect 10, wherein each bond pad may have a depth of between 0.5 μm and 10 μm.

12. A method according to any one of the preceding aspects, wherein the adhesive is dispensed onto discrete areas including each of the first portions of the first structure and/or each of the flexible ICs on the common support.

13. A method according to aspects 12, wherein the adhesive is dispensed onto discrete areas in a controlled amount.

14. A method according to any one of the preceding aspects, wherein the adhesive is conductive, pressure sensitive, non-conductive, isotropic and/or anisotropic.

15. A method according to aspect 14, wherein the adhesive is conductive.

16. A method according to aspect 14, wherein the adhesive is non-conductive.

17. A method according to aspect 14, wherein the non-conductive adhesive is flowed under heat and pressure applied by the heated surface and opposing surface.

18. A method according to aspect 17, wherein the non-conductive adhesive is flowed away from the contact pads of the, or each, first portion by application of heat and pressure from the heated surface and opposing surface such that the adhesive adheres the IC and the first portion together and the terminals of the IC and the contact pads of the first portion are electrically connected and free of non-conductive adhesive.

19. A method according to aspect 17 or aspect 18, wherein the non-conductive adhesive is flowed away from the terminals of the, or each, IC by application of heat and pressure from the heated surface and opposing surface such that the adhesive adheres the IC and the first portion together and the terminals of the IC and the contact pads of the first portion are electrically connected and free of non-conductive adhesive.

20. A method according to any one of the preceding aspects, wherein the flexible first structure is continuously transferred between the heated surface and the opposing surface.

21. A method according to any one of the preceding aspects, wherein the heated surface and the opposing surface are provided by a pair of nip rollers.

22. A method according to aspect 21, wherein each roller in the pair of nip rollers comprises a heated roller surface.

23. A method according to aspect 21 or aspect 22, wherein the, or each, roller of the pair of nip rollers comprises a heated core.

24. A method according to any one of aspects 21 to 23, wherein the, or each, roller of the pair of nip rollers comprises a surface layer wrapped around a core.

25. A method according to aspect 24, wherein the surface layer is heated.

26. A method according to any one of the preceding aspects, wherein a silicone paper layer is located between the electronic circuits and the heated surface to protect the heated surface from fouling with excess adhesive.

27. A method according to any one of aspects 21 to 26, wherein the first structure is transferred between a plurality of pairs of nip rollers in succession.

28. A method according to any one of the preceding aspects, wherein the adhesive is applied to the first structure and/or to the flexible ICs by screen printing, deposition, electro-plating, by jet dispensing or time pressure dispensing.

29. A method according to any one of the preceding aspects, wherein the cured adhesive is treated to improve the bond between the IC and the respective first portion.

30. A method according to any one of the preceding aspects, wherein each first portion comprises an electronic circuit in electrical contact with the group of contact pads.

31. An apparatus arranged to implement a method in accordance with any one of the preceding aspects.

32. An apparatus for bonding a plurality of flexible electronic components (ICs) each comprising a group of terminals to a plurality of respective first portions each comprising a group of contact pads to form a plurality of electronic circuits utilising a curable adhesive, the apparatus comprising:

a heated surface and an opposing surface together providing a gap for receiving a flexible first structure comprising a plurality of first portions;

a first support means (roller, structure, assembly, mechanism) arranged (adapted, configured) to support a flexible first structure comprising the plurality of first portions and controllable to translate said a flexible first structure (i.e. when supported by the first support means) relative to the heated surface and opposing surface and into the gap therebetween;

a second support means (structure, assembly, mechanism) arranged (adapted, configured) to support a second structure, comprising the plurality of flexible electronic components;

an adhesive dispensing means (nozzle, printer, manifold) arranged (adapted, configured) to dispense curable adhesive onto the flexible first portion and/or onto the plurality of flexible electronic components;

a heating means (heating element) arranged (adapted, configured) to heat the heated surface and to cure the curable adhesive, a transfer means (roller, mechanism) to transfer the flexible electronic components from the second structure onto a respective first portion such that each group of terminals is mounted on (brought into electrical contact with) a respective group of contact pads, drive means (roller driving structure, assembly, system, mechanism, or at least one roller driver, for example comprising at least one drive motor) controllable to drive the first support means to translate the flexible first structure relative to said heated surface and opposing surface;

control means (e.g. a control system, or at least one controller, control unit, or control module) arranged to control the drive means and first and second support means to transfer said flexible electronic components (ICs) from the second structure onto the flexible first structure such that each group of terminals is mounted on (brought into electrical contact with) a respective group of contact pads.

33. An apparatus according to aspect 32, wherein the flexible first portion comprises a flexible web circuit.

34. An apparatus according to aspect 33, wherein the flexible web circuit comprises a plurality of first portions.

35. An apparatus according to any one of aspects 32 to 34, wherein the heated surface and the opposing surface are provided by a pair of nip rollers, at least one of the rollers of the pair of nip rollers comprising a heated surface.

36. An apparatus according to aspect 35, wherein each of said rollers in the pair of nip rollers is arranged to rotate about a rotational axis.

37. An apparatus according to any one of aspects 32 to 36, wherein the first support means (roller, structure, assembly, mechanism) is arranged (adapted, configured) to support the flexible web circuit comprising the plurality of first portions and is controllable to translate said a flexible web circuit (i.e. when supported by the first support means) relative to said rotational axes.

38. An apparatus according to any one of aspects 32 to 37, wherein the second support means (structure, assembly, mechanism) is arranged (adapted, configured) to support the second structure comprising the plurality of flexible electronic components.

39. An apparatus according to any one of aspects 35 to 38, wherein the heating means (heating element) is arranged (adapted, configured) to heat the surface of the at least one of the rollers of the pair of nip rollers and to cure the curable adhesive.

40. An apparatus according to any one of aspects 32 to 39, wherein the drive means (roller driving structure, assembly, system, mechanism, or at least one roller driver, for example comprising at least one drive motor) is controllable to drive the first support means to translate the flexible web circuit relative to said respective rotational axes.

41. An apparatus according to any one of aspects 35 to 40, wherein the control means (e.g. a control system, or at least one controller, control unit, or control module) is arranged to control the drive means, the nip rollers and first and second support means to transfer said ICs from the second structure onto the flexible web circuit such that each group of terminals is mounted on (brought into electrical contact with) a respective group of contact pads.

42. An apparatus according to any one of aspects 35 to 41, wherein the control means is arranged to control the distance between the rotational axes of the pair of nip rollers.

43. An apparatus according to any one of aspects 35 to 41, wherein the apparatus comprises two or more pairs of nip rollers.

44. An apparatus according to aspect 43, wherein a heating means (heating element) is arranged (adapted, configured) to heat the surface of at least one of the rollers of each pair of nip rollers.

45. An apparatus according to aspect 43 or aspect 44, wherein the control means is arranged to control the distance between the rotational axes of each pair of nip rollers.

46. An apparatus according to any one of aspects 35 to 45, wherein the, or each roller of the, or each pair of nip rollers comprises a heated core.

47. An apparatus according to aspect 46, wherein the heated core comprises a heating element.

48. An apparatus according to any one of aspects 35 to 47, wherein, the, or each, roller of the pair of nip rollers comprises a surface layer wrapped around a core.

49. An apparatus according to aspect 48, wherein the surface layer is heated.

50. An apparatus according to any one of aspects 32 to 49, further comprising a silicone paper layer between the flexible first structure and the heated surface (e.g. the roller).

51. An apparatus according to aspect 50, wherein the silicone paper layer is located between the flexible electronic components and the heated surface.

52. An apparatus according to any one of aspects 32 to 51, wherein the adhesive dispensing means comprises a screen printer, a jet nozzle dispenser or a time pressure dispenser.

53. An apparatus for manufacturing a plurality of electronic circuits, each electronic circuit comprising a respective first portion, comprising a respective group of contact pads (contacts), and a respective integrated circuit, IC, comprising a respective group of terminals and mounted on the respective group of contact pads with each terminal in electrical contact with a respective contact pad, the apparatus comprising:

a pair of nip rollers, at least one of the rollers of the pair of nip rollers comprising a heated surface, each of said rollers in the pair of nip rollers being arranged to rotate about a rotational axis, a first support means (roller, structure, assembly, mechanism) arranged (adapted, configured) to support a flexible first structure comprising the plurality of first portions and controllable to translate said first flexible structure (i.e. when supported by the first support means) relative to said rotational axes;

a second support means (structure, assembly, mechanism) arranged (adapted, configured) to support a second structure, comprising the plurality of flexible ICs;

an adhesive dispensing means (nozzle, printer) arranged (adapted, configured) to dispense curable adhesive onto the plurality of first portions flexible first structure;

a heating means (heating element) arranged (adapted, configured) to heat the surface of the at least one of the rollers of the pair of nip rollers and to cure the curable adhesive, a transfer means (roller, mechanism) to transfer the flexible ICs from the second structure onto the flexible first structure such that each group of terminals is mounted on (brought into electrical contact with) a respective group of contact pads, drive means (roller driving structure, assembly, system, mechanism, or at least one roller driver, for example comprising at least one drive motor) controllable to drive the first support means to translate the flexible first structure relative to said respective rotational axes;

control means (e.g. a control system, or at least one controller, control unit, or control module) arranged to control the drive means, the nip rollers and first and second support means to transfer said ICs from the second structure onto the flexible first structure such that each group of terminals is mounted on (brought into electrical contact with) a respective group of contact pads.

The invention claimed is:

1. A method of manufacturing a plurality of electronic circuits, each electronic circuit comprising a respective flexible first portion, comprising a respective group of contact pads, and a respective flexible integrated circuit (IC) comprising a respective group of terminals and mounted on the respective group of contact pads with each terminal in electrical contact with a respective contact pad, the method comprising:

providing a flexible first structure comprising the plurality of first portions;

providing a second structure comprising the plurality of flexible ICs and a common support arranged to support the plurality of flexible ICs;

dispensing an adhesive onto the first structure and/or onto the flexible ICs;

transferring said flexible ICs from the common support onto the flexible first structure such that each group of terminals is mounted on a respective group of contact pads to form an electronic circuit, providing a heated surface and an opposing surface together having a gap therebetween, transferring the flexible first structure, comprising the electronic circuits, between the heated surface and the opposing surface such that the adhesive is cured by application of heat and pressure from the heated surface and the opposing surface thereby adhering the IC onto the respective first portion, wherein a silicone paper layer is located between the electronic circuits and the heated surface to protect the heated surface from fouling with excess adhesive, wherein the adhesive forms raised bond pads on at least one flexible IC, wherein each bond pad has a depth between 0.5 µm and 10 µm.

2. The method according to claim 1, wherein the first structure is a flexible web.

3. The method according to claim 1, wherein the flexible ICs comprise a flexible plastic base material.

4. The method according to claim 1, wherein the adhesive is applied as a laminate layer to the first structure and/or to the flexible ICs held on the common support.

5. The method according to claim 1, wherein the adhesive is applied to a predefined area of the first structure, the predefined area comprising at least the area of the first structure comprising the respective group of contact pads of each of the plurality of first portions.

6. The method according to claim 1, wherein the adhesive is applied to a predefined area of the first structure, the predefined area of the first structure comprising an area around the contact pads and excluding the contact pads.

7. The method according to claim 1, wherein the adhesive is applied to a predefined area of an IC.

8. The method according to claim 7, wherein the predefined area comprises at least the area of the IC comprising the respective group of terminals of each of the plurality of ICs, or wherein the predefined area of the IC comprises a base layer of the IC and excludes the terminals of the IC.

9. The method according to claim 1, wherein a non-conductive adhesive is flowed under heat and pressure applied by the heated surface and opposing surface, wherein the non-conductive adhesive is flowed away from the contact pads of at least one first portion by application of heat and pressure from the heated surface and opposing surface such that the non-conductive adhesive adheres an IC and the at least one first portion together and the terminals of the IC and the contact pads of the first portion are electrically connected and free of non-conductive adhesive.

10. The method according to claim 9, wherein the non-conductive adhesive is flowed away from the terminals of at least one IC by application of heat and pressure from the heated surface and opposing surface such that the non-conductive adhesive adheres the IC and the first portion together and the terminals of the IC and the contact pads of the first portion are electrically connected and free of non-conductive adhesive.

11. The method according to claim 1, wherein the flexible first structure is continuously transferred between the heated surface and the opposing surface.

12. The method according to claim 1, wherein the adhesive is applied to the first structure and/or to the flexible ICs by screen printing, deposition, electro-plating, by jet dispensing or time pressure dispensing.

* * * * *